(12) United States Patent
Lu

(10) Patent No.: US 10,795,765 B2
(45) Date of Patent: Oct. 6, 2020

(54) SSD FOR LONG TERM DATA RETENTION

(71) Applicant: NGD SYSTEMS, INC., Irvine, CA (US)

(72) Inventor: Guangming Lu, Irvine, CA (US)

(73) Assignee: NGD SYSTEMS, INC., Irvine, CA (US)

( * ) Notice: Subject to any disclaimer, the term of this patent is extended or adjusted under 35 U.S.C. 154(b) by 0 days.

(21) Appl. No.: 16/592,727

(22) Filed: Oct. 3, 2019

(65) Prior Publication Data

US 2020/0034233 A1 Jan. 30, 2020

Related U.S. Application Data

(63) Continuation-in-part of application No. 16/573,962, filed on Sep. 17, 2019, which is a continuation of (Continued)

(51) Int. Cl.
*H03M 13/00* (2006.01)
*G06F 11/10* (2006.01)
(Continued)

(52) U.S. Cl.
CPC ...... *G06F 11/1068* (2013.01); *G06F 11/1012* (2013.01); *G11C 11/5642* (2013.01); *G11C 16/26* (2013.01); *G11C 16/28* (2013.01); *G11C 29/021* (2013.01); *G11C 29/028* (2013.01); *G11C 29/52* (2013.01); *H03M 13/1108* (2013.01); *H03M 13/2906* (2013.01); *H03M 13/2951* (2013.01); *H03M 13/3707* (2013.01); *H03M 13/3723* (2013.01); *H03M 13/3769* (2013.01); *H03M 13/6325* (2013.01); *G11C 29/42* (2013.01); *G11C 2029/0411* (2013.01); *H03M 13/09* (2013.01); *H03M 13/1111* (2013.01)

(58) Field of Classification Search
CPC ............. G06F 11/1068; G06F 11/1012; G11C 11/5642; G11C 16/16; H03M 13/1108
See application file for complete search history.

(56) References Cited

U.S. PATENT DOCUMENTS 7,778,197 B2 * 8/2010 Kim ...................... H04L 1/1819
370/252
8,250,437 B2 8/2012 Sakurada et al.
(Continued)

FOREIGN PATENT DOCUMENTS

WO    WO 2009/002940 A2    12/2008

*Primary Examiner* — Esaw T Abraham
(74) *Attorney, Agent, or Firm* — Lewis Roca Rothgerber Christie LLP

(57) ABSTRACT

A system and method for long term data retention in a flash memory. In some embodiments, the method includes transitioning the flash memory to a long term data retention state by re-storing first encoded data, the first encoded data being initially stored in the flash memory at a first code rate. The re-storing may include determining a second code rate, lower than the first code rate; reading the first encoded data from the flash memory; decoding the first encoded data at the first code rate to obtain first decoded data; encoding the first decoded data at the second code rate to form second encoded data; and storing the second encoded data in the flash memory.

19 Claims, 9 Drawing Sheets

Related U.S. Application Data application No. 15/723,041, filed on Oct. 2, 2017, now Pat. No. 10,417,087, which is a continuation-in-part of application No. 15/230,075, filed on Aug. 5, 2016, now Pat. No. 10,216,572, which is a continuation-in-part of application No. 14/806,063, filed on Jul. 22, 2015, now abandoned.

(60) Provisional application No. 62/742,053, filed on Oct. 5, 2018, provisional application No. 62/403,610, filed on Oct. 3, 2016, provisional application No. 62/027,683, filed on Jul. 22, 2014.

(51) Int. Cl.

| | | |
|---|---|---|
| *G11C 11/56* | (2006.01) | |
| *G11C 16/26* | (2006.01) | |
| *G11C 29/02* | (2006.01) | |
| *H03M 13/11* | (2006.01) | |
| *H03M 13/29* | (2006.01) | |
| *H03M 13/37* | (2006.01) | |
| *G11C 16/28* | (2006.01) | |
| *G11C 29/52* | (2006.01) | |
| *G11C 29/42* | (2006.01) | |
| *G11C 29/04* | (2006.01) | |
| *H03M 13/09* | (2006.01) | |

(56) References Cited

U.S. PATENT DOCUMENTS

| | | | |
|---|---|---|---|
| 8,327,245 B2* | 12/2012 | Radke | G06F 11/1068 |
| | | | 714/790 |
| 8,363,738 B2* | 1/2013 | Gorokhov | H03M 13/29 |
| | | | 375/259 |
| 8,707,132 B2 | 4/2014 | Nakagawa et al. | |
| 8,762,798 B2* | 6/2014 | Hu | H03M 13/13 |
| | | | 714/704 |
| 8,869,009 B2* | 10/2014 | Gurgi | G06F 11/1008 |
| | | | 714/773 |
| 8,875,003 B1 | 10/2014 | Wolter et al. | |
| 8,924,824 B1 | 12/2014 | Lu | |
| 9,013,920 B2* | 4/2015 | Stoev | G11C 16/3454 |
| | | | 365/185.09 |
| 9,047,882 B2* | 6/2015 | Pan | G11B 5/012 |
| 9,214,963 B1* | 12/2015 | Garani | H03M 13/1102 |
| 9,244,763 B1 | 1/2016 | Kankani et al. | |
| 9,633,740 B1 | 4/2017 | Alhussien et al. | |
| 9,697,077 B2 | 7/2017 | Sokolov et al. | |
| 9,831,969 B2* | 11/2017 | Song | H04H 60/11 |
| 9,870,830 B1 | 1/2018 | Jeon | |
| 10,263,814 B2* | 4/2019 | Eroz | H04L 1/0066 |
| 2003/0174771 A1* | 9/2003 | Sugahara | H04N 19/70 |
| | | | 375/240.03 |
| 2008/0106936 A1 | 5/2008 | Yang et al. | |
| 2008/0109703 A1 | 5/2008 | Brandman | |
| 2008/0263265 A1 | 10/2008 | Litsyn et al. | |
| 2010/0020611 A1 | 1/2010 | Park | |
| 2011/0066902 A1 | 3/2011 | Sharon et al. | |
| 2013/0132652 A1 | 5/2013 | Wood et al. | |
| 2014/0040704 A1 | 2/2014 | Wu et al. | |
| 2014/0056068 A1 | 2/2014 | Strasser et al. | |
| 2014/0149825 A1 | 5/2014 | Motwani et al. | |
| 2015/0127883 A1 | 5/2015 | Chen et al. | |
| 2015/0193302 A1 | 7/2015 | Hyun et al. | |
| 2015/0309872 A1 | 10/2015 | Cai et al. | |
| 2015/0339189 A1 | 11/2015 | Wu et al. | |
| 2016/0006462 A1 | 1/2016 | Hanham et al. | |
| 2016/0274969 A1 | 9/2016 | Chen et al. | |
| 2016/0306694 A1 | 10/2016 | Tai et al. | |
| 2017/0024279 A1 | 1/2017 | Lu | |

\* cited by examiner

SSD FOR LONG TERM DATA RETENTION

CROSS-REFERENCE TO RELATED APPLICATION(S)

The present application claims priority to and the benefit of U.S. Provisional Application No. 62/742,053, filed Oct. 5, 2018, entitled "METHOD OF INCREASING SSD LONG TERM DATA RETENTION DURATION", and is a continuation-in-part of U.S. patent application Ser. No. 16/573,962 ("the '962 Application"), filed Sep. 17, 2019, which is a continuation of U.S. patent application Ser. No. 15/723,041, filed Oct. 2, 2017, now U.S. Pat. No. 10,417,087, issued Sep. 17, 2019; U.S. patent application Ser. No. 15/723,041 claims priority to and the benefit of U.S. Provisional Application No. 62/403,610, filed Oct. 3, 2016, and is continuation-in-part of U.S. patent application Ser. No. 15/230,075, filed Aug. 5, 2016, now U.S. Pat. No. 10,216,572, issued Feb. 26, 2019; U.S. patent application Ser. No. 15/230,075 is a continuation-in-part of U.S. patent application Ser. No. 14/806,063, filed Jul. 22, 2015, which claims priority to and the benefit of U.S. Provisional Application No. 62/027,683 filed Jul. 22, 2014. The entire contents of all of the applications identified in this paragraph are hereby incorporated herein by reference.

FIELD

One or more aspects of embodiments according to the present disclosure relate to data storage, and more particularly to a system and method for improving the data retention characteristics of a storage system using flash memory.

BACKGROUND

As lithographic geometry for NAND flash chips becomes smaller and the area of the memory cells becomes smaller, the number of electrons that may be used in storage decreases, and it may become more difficult to assure accurate storage of information. High-capacity NAND flash memory may achieve high density storage by using multi-level cells (2 bits/cell for multi-level cell (MLC), 3 bits/cell for triple-level cell (TLC), or 4 bits/cell for quad-level cell (QLC)) to store more than one bit per cell. The number of levels may increase further to provide more storage capability in the future. The increasing number of levels (and smaller distance between levels) and a corresponding reduction in the lower signal-to-noise ratio of the read channel may make a stronger error-correction code (ECC) advantageous.

The JEDEC JESD218 standard provides for both endurance and data retention requirements, for a solid state drive (SSD) built upon NAND flash. In the standard, "endurance" is the ability of NAND flash to withstand a number of erase and program cycles (or "P/E count"), and "data retention" is the ability of the SSD to retain data over time without unacceptable data loss.

Users of flash memory may on occasion have a need to preserve data stored in such memory over a long time interval, with or without accessing the data during that interval, and possibly with the flash memory system (e.g., an SSD including the flash memory) shut off. Thus, there is a need for a system and method for improving the data retention characteristics of a storage system using flash memory.

SUMMARY

According to some embodiments of the present invention, there is provided a method, including: transitioning a flash memory to a long term data retention state by re-storing first encoded data, the first encoded data being initially stored in the flash memory at a first code rate, the re-storing including: determining a second code rate, lower than the first code rate; reading the first encoded data from the flash memory; decoding the first encoded data at the first code rate to obtain first decoded data; encoding the first decoded data at the second code rate to form second encoded data; and storing the second encoded data in the flash memory.

In some embodiments, the re-storing further includes, after reading a portion of the first encoded data from a first physical block of the flash memory, erasing the first physical block.

In some embodiments, the method further includes erasing a second physical block after erasing the first physical block, the amount of valid data on the first physical block before the erasing of the first physical block being less than the amount of valid data on the second physical block before the erasing of the second physical block.

In some embodiments, the re-storing further includes reading all valid data from the first physical block before erasing the first physical block.

In some embodiments, the determining of the second code rate includes selecting a code rate greater than a first ratio, the first ratio being the ratio of: a total data volume and a total available capacity.

In some embodiments, the total data volume is a sum of a total user data volume and a total system data volume; the total available capacity is a difference between a total capacity and a reserve capacity; and the selecting of a code rate greater than a first ratio includes selecting from among a set of available code rates the smallest code rate greater than the first ratio.

In some embodiments, the method further includes, in response to a request from a host: reading, while in the long term data retention state, a portion of the second encoded data, decoding the portion of the second encoded data to obtain decoded data, and sending the decoded data to the host.

In some embodiments, the method further includes, before the reading of the portion of the second encoded data: performing a plurality of trial reads at different respective threshold voltages from the flash memory, to obtain a corresponding set of raw data words; performing, with the raw data words, one or more successful decoding attempts and zero or more unsuccessful decoding attempts, to obtain an error rate for each successful coding attempt; and selecting a threshold voltage for use during the reading of the portion of the second encoded data.

In some embodiments: the performing of the one or more successful decoding attempts includes performing a plurality of successful decoding attempts; and the selecting of the threshold voltage for use during the reading of the portion of the second encoded data includes selecting a threshold voltage used during a successful decoding attempt, of the plurality of successful decoding attempts, having a minimum error rate.

In some embodiments, the reading of the portion of the second encoded data includes: performing a first read operation on a first plurality of flash memory cells, at a first reference voltage, to form a first raw data word; executing a first error correction code decoding attempt with the first raw data word; when the first error correction code decoding attempt succeeds: outputting a decoded data word generated by the first error correction code decoding attempt; and when the first error correction code decoding attempt does not succeed: performing a second read operation on the first plurality of flash memory cells, at a second reference voltage, to form a second raw data word; and executing a second error correction code decoding attempt with the first raw data word and the second raw data word.

In some embodiments, the method further includes transitioning from the long term data retention state to a normal operating state, the transitioning including: reading the second encoded data from the flash memory; decoding the second encoded data to obtain second decoded data; encoding the second decoded data at a third code rate, greater than the second code rate, to obtain third encoded data; and storing the third encoded data in the flash memory.

In some embodiments, the method further includes, before the reading of the second encoded data: performing a plurality of trial reads at different respective threshold voltages from the flash memory, to obtain a corresponding set of raw data words; performing, with the raw data words, one or more successful decoding attempts and zero or more unsuccessful decoding attempts, to obtain an error rate for each successful coding attempt; and selecting a threshold voltage for use during the reading of the second encoded data.

In some embodiments: the performing of the one or more successful decoding attempts includes performing a plurality of successful decoding attempts; and the selecting of the threshold voltage for use during the reading of the second encoded data includes selecting a threshold voltage used during a successful decoding attempt, of the plurality of successful decoding attempts, having a minimum error rate.

According to some embodiments of the present invention, there is provided a solid state drive, including: a flash memory; and a processing circuit, the processing circuit being configured to transition the flash memory to a long term data retention state by re-storing first encoded data, the first encoded data being initially stored in the flash memory at a first code rate, the re-storing including: determining a second code rate, lower than the first code rate; reading the first encoded data from the flash memory; decoding the first encoded data at the first code rate to obtain first decoded data; encoding the first decoded data at the second code rate to form second encoded data; and storing the second encoded data in the flash memory.

In some embodiments, the method further includes an error correcting code engine, the error correcting code engine being capable of: encoding data at the first code rate; encoding data at the second code rate; decoding data at the first code rate; and decoding data at the second code rate.

In some embodiments, the processing circuit is configured, in response to a request from a host, to: read, while in the long term data retention state, a portion of the second encoded data, decode the portion of the second encoded data to obtain decoded data, and send the decoded data to the host.

In some embodiments, the processing circuit is further configured, before the reading of the portion of the second encoded data, to: perform a plurality of trial reads at different respective threshold voltages from the flash memory, to obtain a corresponding set of raw data words; perform, with the raw data words, one or more successful decoding attempts and zero or more unsuccessful decoding attempts, to obtain an error rate for each successful coding attempt; and select a threshold voltage for use during the reading of the portion of the second encoded data.

In some embodiments, the performing of the one or more successful decoding attempts includes performing a plurality of successful decoding attempts; and the selecting of the threshold voltage for use during the reading of the portion of the second encoded data includes selecting a threshold voltage used during a successful decoding attempt, of the plurality of successful decoding attempts, having a minimum error rate.

In some embodiments, the processing circuit is further configured to transition from the long term data retention state to a normal operating state, the transitioning including: reading the second encoded data from the flash memory; decoding the second encoded data to obtain second decoded data; encoding the second decoded data at a third code rate, greater than the second code rate, to obtain third encoded data; and storing the third encoded data in the flash memory.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a system and method for improving the data retention characteristics of a storage system using flash memory provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
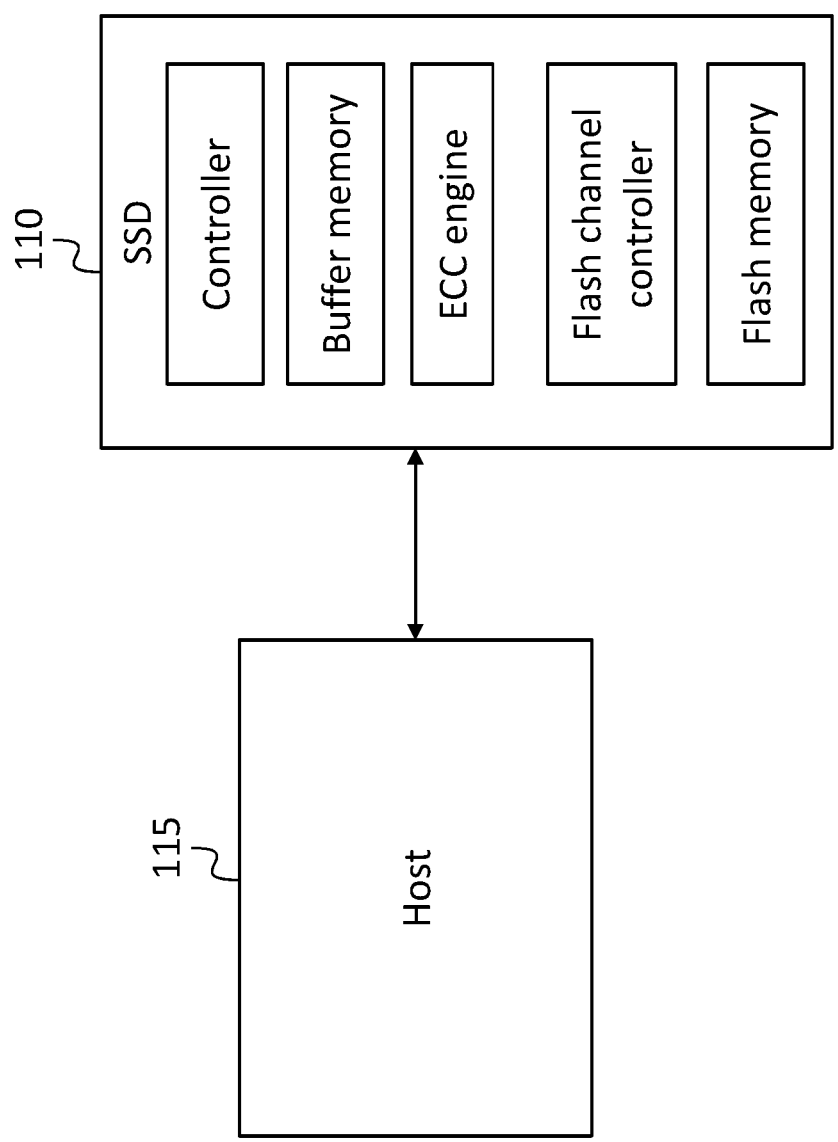
FIG. 1 is a block diagram of a host and a solid state drive, according to an embodiment of the present disclosure.

Referring to FIG. 1, in some embodiments a solid state drive 110 may, in operation, be connected to, and provide storage for, a host 115, e.g., a server or other computer. The host interface (including the host connector, and the communications protocols) between the solid state drive 110 and the host may be, for example, a storage interface such as Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, or a more general-purpose interface such as Ethernet or Universal Serial Bus (USB). In some embodiments, the solid state drive 110 may conform to a 3.5 inch hard drive form-factor (or "large form factor" (LFF)) standard, or it may conform to a 2.5 inch hard drive form-factor (or small form factor (SFF)) standard. In other embodiments the solid state drive 110 may conform to a standard PCIe card form factor, e.g., a full-height, full length (FH-FL) card outline, or a full-height, half length (FH-HL) outline.

The solid state drive 110 may include a controller, buffer memory, error correcting code (ECC) engine, flash channel controller, and flash memory, as shown, all of the components of the solid state drive 110 being connected together. The controller may execute software and/or firmware, stored, for example, in the buffer memory, or in read-only memory in the controller (or separate from the controller). The ECC engine may encode data being written to the flash memory (through the flash channel controller), and decode data being read from the flash memory (through the flash channel controller); such encoding and decoding may make it possible to correct for bit errors, in the encoded data read from the flash memory, that may occur as a result of data degradation in the flash memory, or inaccuracy in writing or reading the flash memory cells.

Figure 2A:
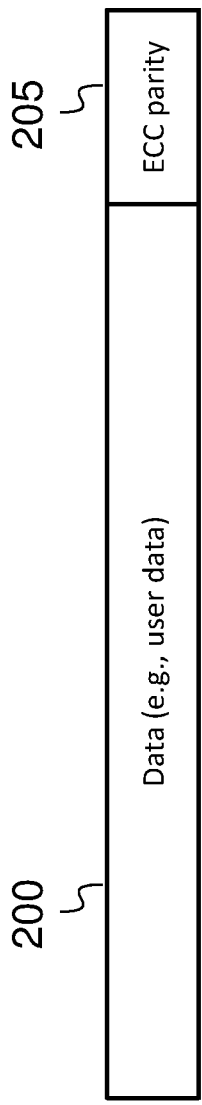
FIG. 2A is a data encoding diagram, according to an embodiment of the present disclosure.

The solid state drive 110 may include a flash memory, as shown. Data, e.g., user data to be stored in the flash memory at the request of the host, may be encoded, using an error correcting code, to form encoded data, and the encoded data may then be stored in the flash memory. Referring to FIG. 2A, the encoded data will be larger than the user data, and may, for example, include both the user data, and error correction code (ECC) parity bits. The error correction code parity bits may be redundant bits that may be used to detect data errors in the user data, or to correct data errors in the user data, e.g., using a Hamming code, a Reed-Solomon code, a Bose-Chaudhuri-Hocquenghem (BCH) code, or a Low-Density Parity Check (LDPC) code. In some embodiments, the parity bits are not separate, and the encoding process creates, from each (unencoded) quantity of user data a larger encoded code word with interleaved user data bits and parity bits.

Figure 2B:
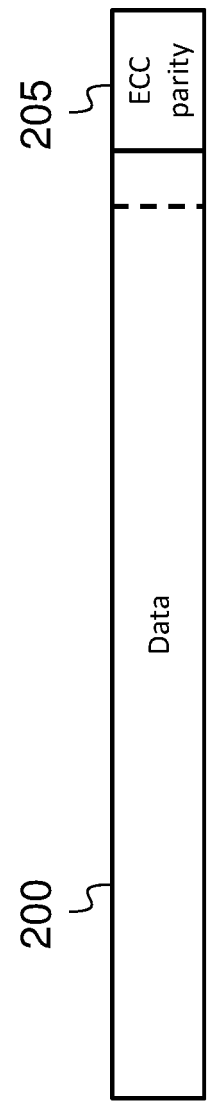
FIG. 2B is a data encoding diagram, according to an embodiment of the present disclosure.
Figure 2C:
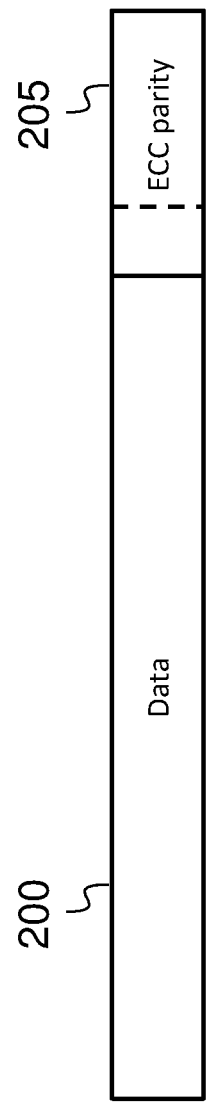
FIG. 2C is a data encoding diagram, according to an embodiment of the present disclosure.

The ratio of the size of the unencoded code word to the size of the encoded code word may be referred to as the "code rate". Generally, the greater the amount by which the encoding enlarges the data, the "stronger" the error correction code is, i.e., the more capable it is of correcting errors in the data. For example, when a lower code rate is used, the error correction code may be capable of correcting, during decoding, a larger number of bit errors than when a higher code rate is used. FIG. 2A shows the result of encoding data using a first code rate, with the encoding producing a number of parity bits (or "ECC parity" bits) that are stored along with the data. In the example of FIG. 2A, the encoded data consists of (i) the unencoded data and (ii) the parity bits. FIG. 2B shows the result of encoding data using another code rate, higher than that of FIG. 2A, and FIG. 2C shows the result of encoding data using yet another code rate, lower than that of FIG. 2A. In normal operation, a solid state drive may use a code rate referred to as an "operating code rate", selected to balance the competing goals of (i) avoiding the use of more storage space than necessary and (ii) being able to correct as many bit errors as possible. The operating code rate may vary with time and may also vary from block to block within the solid state drive, because, for example, flash memory cells may degrade differently with use.

Figure 3:
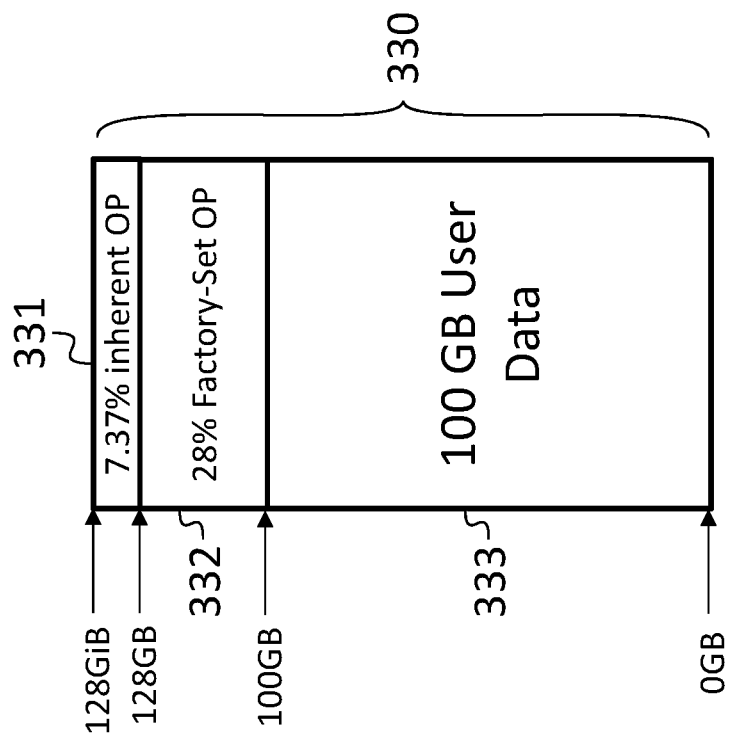
FIG. 3 is a space allocation diagram, according to an embodiment of the present disclosure.

Because a solid state drive may ordinarily be specified (e.g., to the host, or to a customer selecting a solid state drive) based on the amount of unencoded data it can store, the solid state drive may be constructed to contain more raw storage capacity (e.g., more flash memory) than the amount of unencoded data it is specified for. This type of construction may be referred to as "overprovisioning". FIG. 3 shows an example of overprovisioning, which may include factory-set overprovisioning and "inherent" overprovisioning, where "inherent" overprovisioning is overprovisioning resulting from (i) the custom of specifying storage capacity in gigabytes (GB) (units of $10^8$ bytes), and (ii) memory chips' commonly being manufactured in sizes that are even numbers of (or integer fractions of) gibi bytes (GiB) ($2^{30}$ bytes).

Figure 4A:
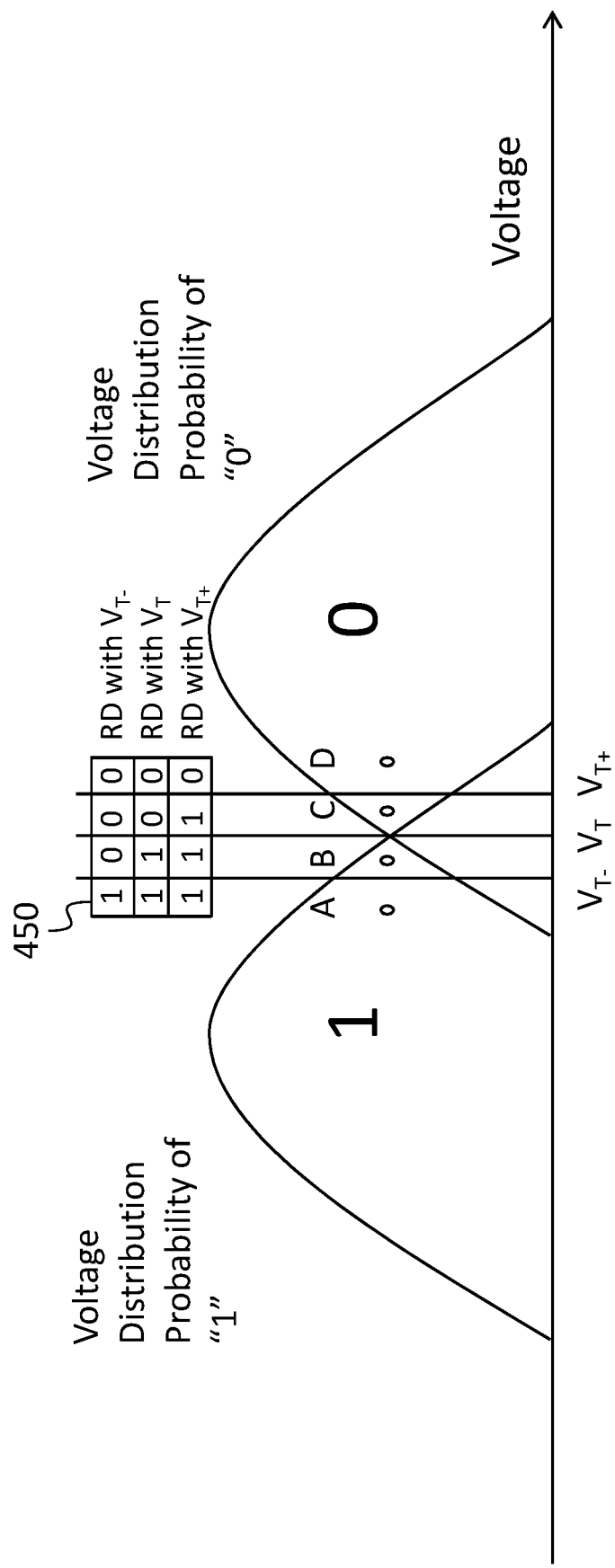
FIG. 4A is a voltage distribution diagram, according to an embodiment of the present disclosure.
Figure 4B:
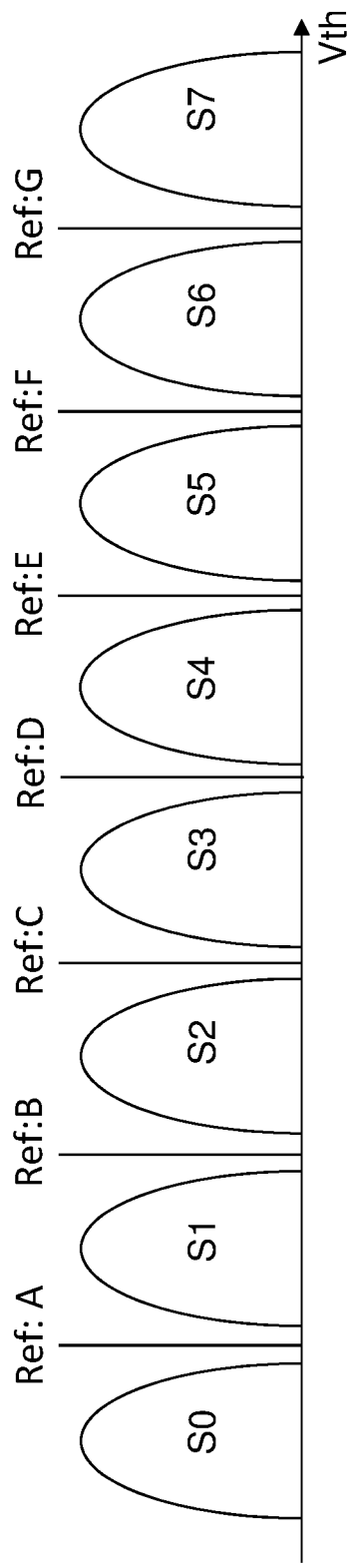
FIG. 4B is a multi-level voltage diagram, according to an embodiment of the present disclosure.

The distributions of voltages corresponding to the levels of a flash memory cell may shift and widen over time, after a set of cells is written. Referring to FIG. 4A, if read operations are performed with each of three available reference voltage values of $V_{T-}$, $V_T$, and $V_{T+}$, then, given the results of the read operations, the threshold voltage may be inferred to be in one of four regions, labelled A, B, C, and D in FIG. 4A, and corresponding respectively to threshold voltage values that are (i) less than $V_{T-}$ (ii) greater than $V_{T-}$ and less than $V_T$, (iii) greater than $V_T$ and less than and $V_{T+}$, and (iv) greater than $V_{T+}$. The read result table 450 of FIG. 4A shows the result of each of the read operations for each of these four cases. For example, if the threshold voltage is in region B, then the three read operations (with reference voltages of $V_{T-}$, $V_T$, and $V_{T+}$) may generate raw data of {0 1 1}, as shown in the second column of the read result table 450. As used herein, a list of binary digits between brace brackets (e.g., {0 1 1}) represents a sequence of raw bits obtained from multiple read operations performed at respective reference voltages of a corresponding sequence of reference voltages. Referring to FIG. 4B, a triple-level cell has eight levels of voltage-bands separated by seven voltage thresholds, and each MSB/CSB/LSB is delimited by 2 or 4 voltage thresholds.

The flash memory may be configured as a plurality of physical blocks. Each physical block may be the smallest quantity of flash memory capable of being erased at a time, although it may be possible to read or write fractions of a physical block. As such, when a command to overwrite old data with new data is received from the host, the solid state drive may, instead of erasing the entire physical block containing the old data, write the new data in a different free region of flash memory, and mark the flash memory cells containing the old data as invalid. Each cell in the flash memory flash memory may be valid, invalid, or free. When a physical block contains a high proportion of invalid data, the solid state drive may (in a process referred to as "garbage collection") move the remaining valid data in the physical block to one or more other physical blocks (decoding and re-encoding the data as needed), and erase the entire physical block so that all of the cells in it become free (i.e., available for writing).

Figure 5:
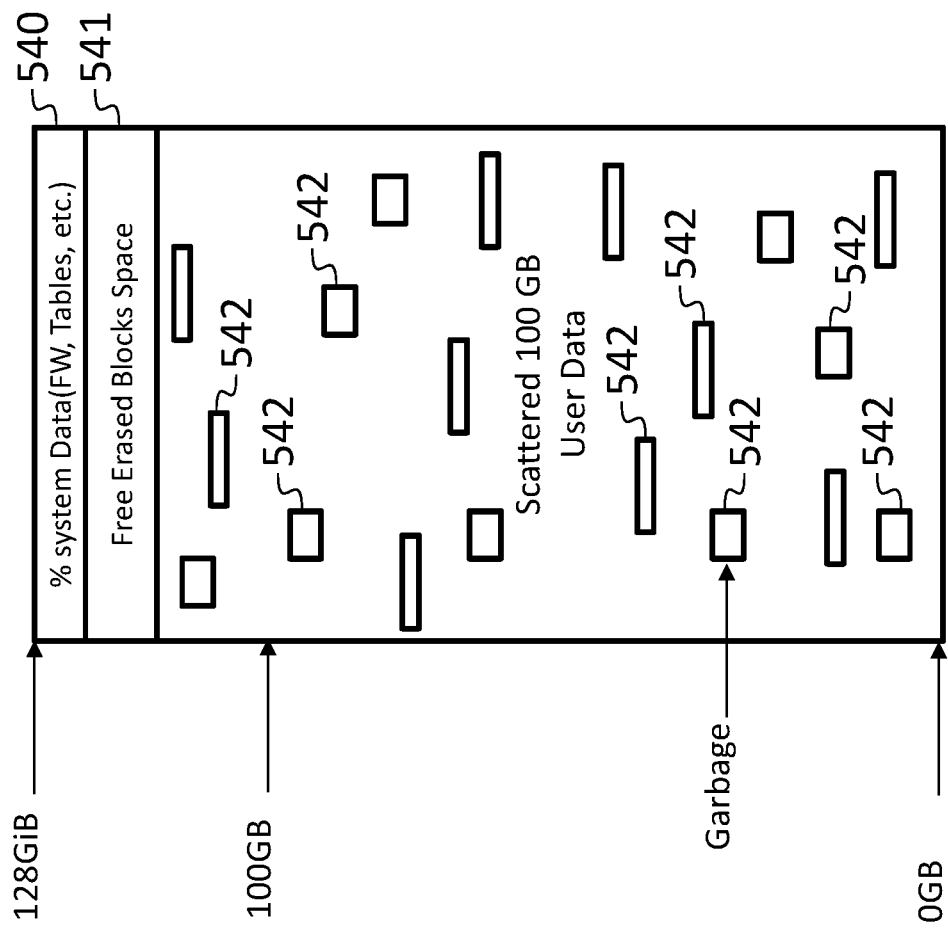
FIG. 5 is a space allocation diagram, according to an embodiment of the present disclosure.

FIG. 5 shows an example of a data layout in the NAND flash memory. A system data area 540 is used by firmware, for tables, logs and other meta-data. The system data area 540 is, like user data, protected by error correction code encoding. A free portion 541 of the flash memory includes erased free blocks or block stripes created by garbage collection. The flash memory also includes blocks or block stripes that contain user data, and/or, invalid data (or "garbage") 542 scattered among the user data.

In some embodiments, the solid state drive may be configured to transition (e.g., at the instruction of the host) to a long term data retention (LTDR) state. The transition may involve decreasing the code rate for some or all of the data stored in the solid state drive, so that it will be better able to endure a long period of inactivity without data loss. In some embodiments, all of the data (both the user data and the system data) are re-stored in the flash memory at a lower code rate (where "re-storing" means storing the same data in a different form, e.g., encoded with a different code rate). In other embodiments substantially all (e.g., at least 60%, or at least 80%, or at least 90%, or between 60% and 100%, of the stored data (e.g. of the stored user data or of the stored system data) are re-stored in the flash memory at a lower code rate.

Figure 6:
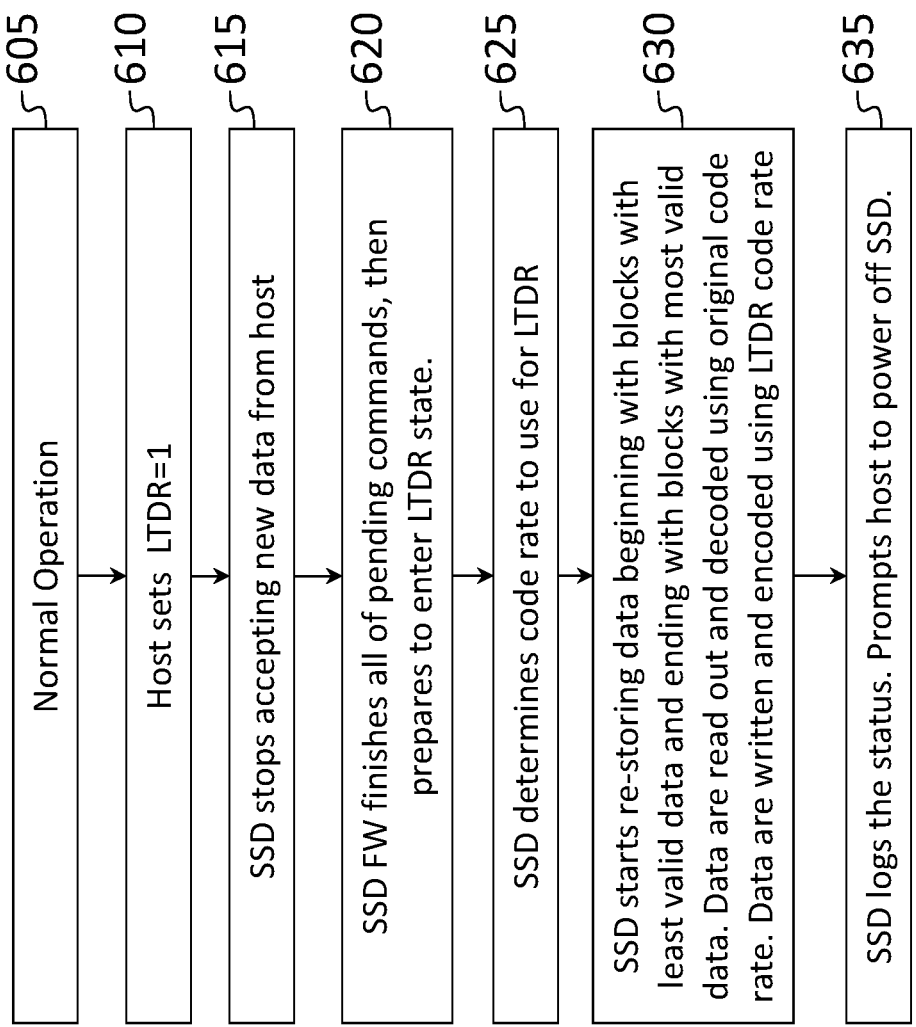
FIG. 6 is a flow chart, according to an embodiment of the present disclosure.

In normal operation, data may be stored in the solid state drive at a first code rate, e.g., an operating code rate. Referring to FIG. 6, the process of transitioning to the long term data retention state may proceed as follows. Beginning, at 605, with normal operation, the host may instruct, at 610, the solid state drive to transition to the long term data retention state. The solid state drive may then, at 615, stop accepting new data from the host, and, at 620, finish all pending commands. The solid state drive may then, at 625, determine (as discussed in further detail below) the code rate (e.g., a second code rate), lower than the first code rate, to be used for the long term data retention state. At 630, the solid state drive may re-store the data (user data and system data) stored on the solid state drive. The re-storing may include reading out the data (or "first encoded data") (which may be stored at an operating code rate), decoding the first encoded data, re-encoding the data at the second code rate (to create encoded data that may be referred to as "second encoded data"), and storing the second encoded data in the flash memory.

The determining, at 625, of the second code rate may be performed as follows, based on information regarding variable code rates supported by the ECC encoder/decoder, the raw size of the flash memory, and the space used. The following equation may be used:

$$CR_{min} = \min(CR_{ecc} | CR_{ecc} > (U(GB)+S(GB))/((C(GiB)-Y(GiB))*1.0737/CR_{def}).$$

In this equation, U(GB) is the unencoded size of the used user data space in GB, and S(GB) is the unencoded size of the used system data space in GB. The precise value of S(GB) may not be readily available to the SSD controller, and an estimated number or an upper-bound number may be used. C(GiB) is the total NAND flash space acquired from the flash vendor in GiB (i.e., it is the effective storage capacity of the flash memory (which is smaller than the total flash memory capacity present), assuming that data will be encoded with the default code rate before being stored), and Y(GiB) is the minimum reserved free block space (discussed in further detail below) in GiB (multiplying (C(GiB)-Y(GiB)) by 1.0737 converts this quantity from units of GiB to units of GB). The effective storage capacity C is used in the expression above because vendors of flash media may specify the effective size, for data stored at the default code rate, of flash media chips or flash dies. $CR_{def}$ is the default code rate. $(C(GiB)-Y(GiB))*1.0737/CR_{def}$ is all space including spare bytes.

The expression $$(U(GB)+S(GB))/((C(GiB)-Y(GiB))*1.0737/CR_{def})$$

gives the lowest code rate at which all of the user data and system data would fit into the flash memory while leaving vacant the specified reserved free pool 751. The ECC engine, however, may not be able to provide an arbitrary code rate, and may instead be capable of operating with any one of a set of available code rates. The equation above, for $CR_{min}$, therefore selects, from among the set of available code rates, the smallest one that exceeds $$(U(GB)+S(GB))/((C(GiB)-Y(GiB))*1.0737/CR_{def}).$$

The above expression may be seen to be the ratio of a total data volume and a total available capacity, where (i) the total data volume is a sum of a total user data volume (U) and a total system data volume (S) and (ii) the total available capacity is a difference between a total capacity (C) and a reserve capacity (the size Y of the reserved free pool 751). In this status, overprovisioning is reduced to 0. The above equation for $CR_{min}$ may also be written as follows:

$$CR_{min} = \min(CR_{ecc} | CR_{ecc} > (U_{unenc}+S_{unenc})/(C_{raw}-Y_{raw}))$$

where the subscripts "unenc" and "raw" refer to sizes and capacities assuming that data are not encoded, or are encoded at a code rate of 1. For example, $U_{unenc}$ is the unencoded size of the user data, i.e., the size of the data as processed by the host, and $C_{raw}$ is the capacity without encoding. In the above equation the units are omitted, and the equation will produce the same result regardless of whether units GB or GiB are used, if the same units are used throughout. The expression $(U_{unenc}+S_{unenc})/(C_{raw}-Y_{raw})$ is also the ratio of a total data volume and a total available capacity, where (i) the total data volume is a sum of a total user data volume ($U_{unenc}$) and a total system data volume ($S_{unenc}$) and (ii) the total available capacity is a difference between a total capacity ($C_{raw}$) and a reserve capacity ($Y_{raw}$) (the size of the reserved free pool 751).

The process of re-storing may be performed beginning with the physical block (e.g., a "first physical block") that has the least valid data. The valid data may be read out, decoded, re-encoded, and stored in another free erased physical block, and the first physical block may then be erased to become free erased blocks. The process may then be repeated for each remaining physical block that has valid data (encoded at, e.g., an operating code rate), in order of increasing amount of valid data. This order may reduce the risk that the solid state drive may run out of free erased block space during the process of re-storing. If the solid state drive nonetheless runs out of free erased block space during the process of re-storing, then the normal garbage collection may be invoked to obtain additional free erased blocks.

Once all of the data have been re-stored, the solid state drive may log its status (by saving a log file/status in the flash memory/or other non-volatile memory, e.g. on-board SPI flash), and prompt the host to shut off power to the solid state drive. An operator may then unplug the solid state drive and place it in storage (e.g., temperature-controlled storage, which may reduce the extent to which high temperatures may accelerate degradation of data on the device).

Figure 7:
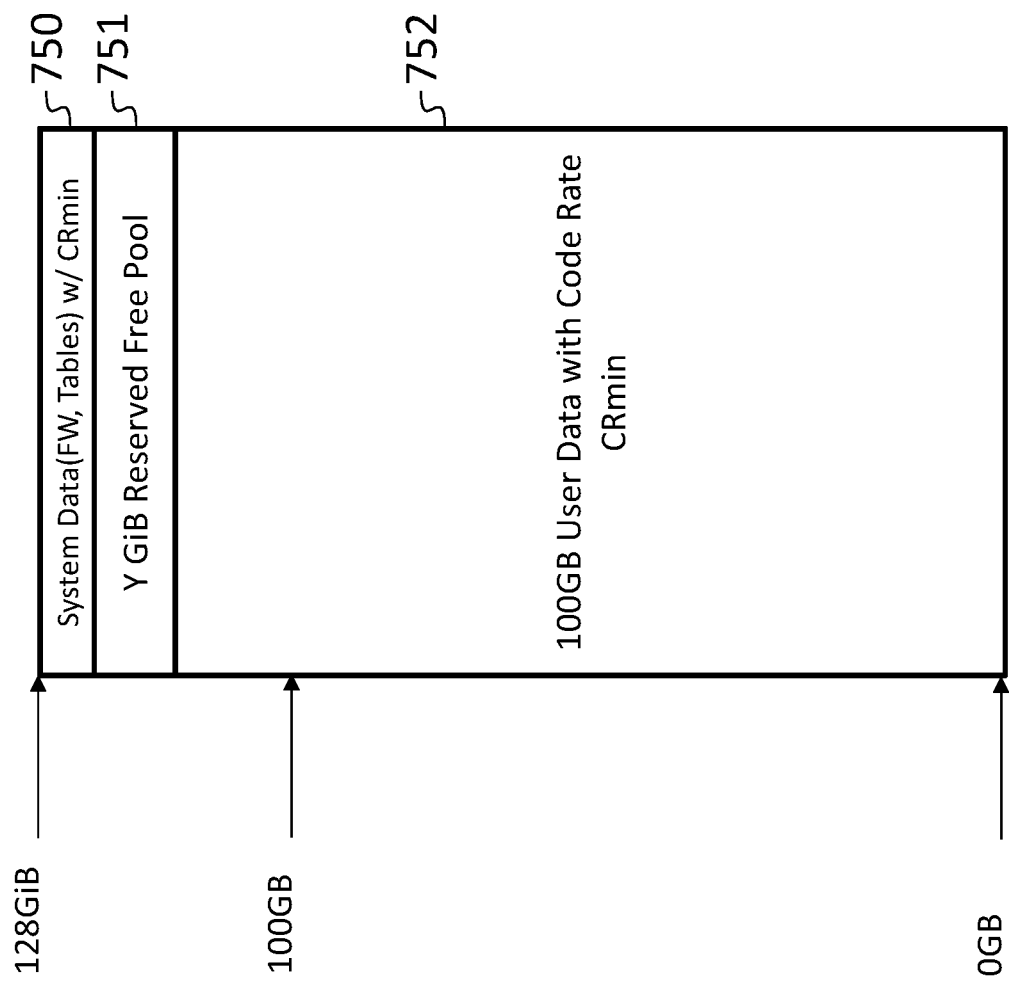
FIG. 7 is a space allocation diagram, according to an embodiment of the present disclosure.

FIG. 7 shows the allocation, at the end of the process of preparing the solid state drive for long term data retention, of the flash memory to encoded system data 750 (encoded at the second code rate), encoded user data 752 (also encoded at the second code rate), and a reserved free pool 751. The reserved free pool 751 may be used for (and sized to perform) write operations after returning from the long term data retention state to a normal operating state, and before the re-storing of the data at the higher code rate (e.g., a third code rate, which may be equal to an operating code rate) is complete.

Figure 8:
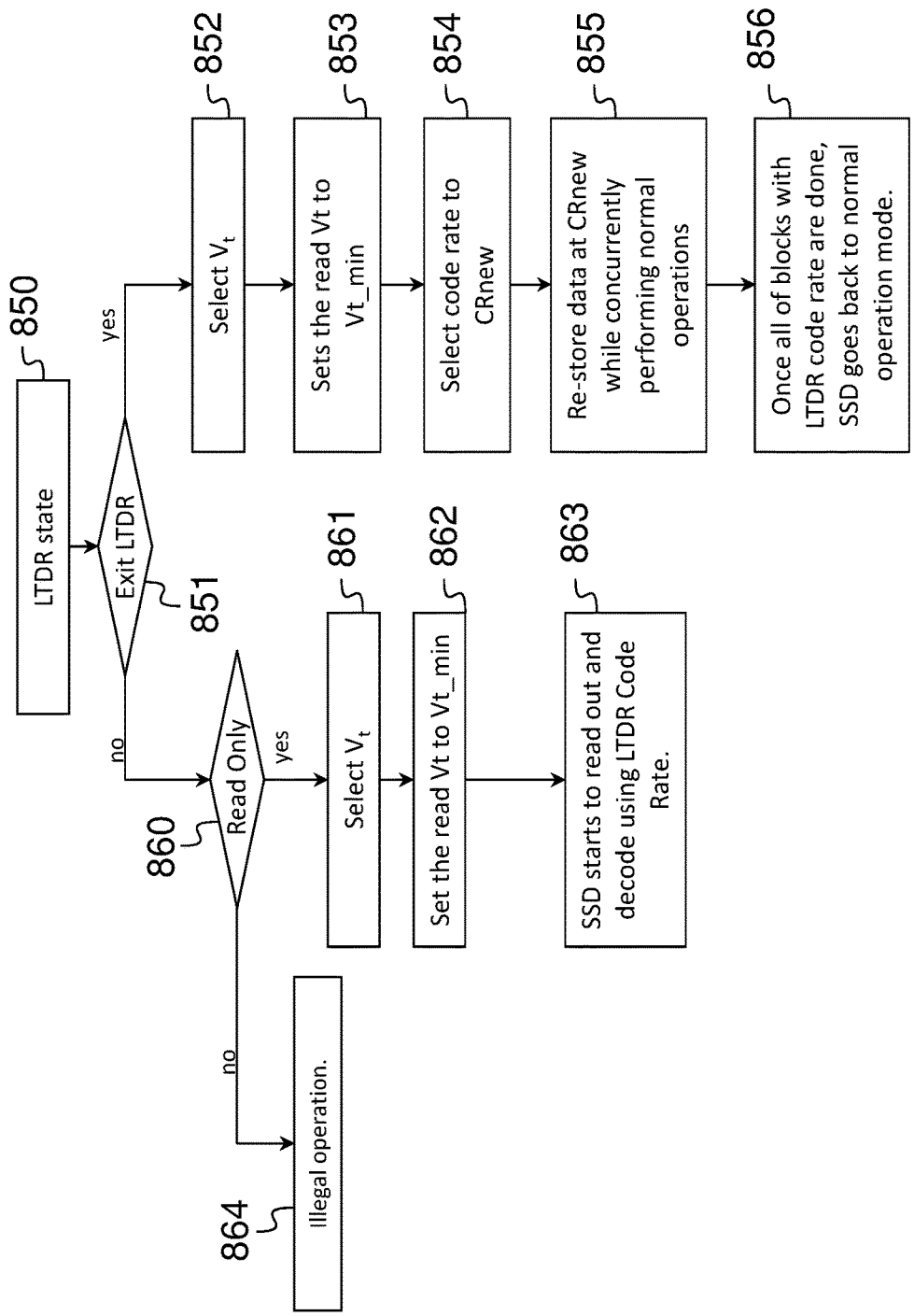
FIG. 8 is a flow chart, according to an embodiment of the present disclosure.

FIG. 8 is a flow chart of operations after the solid state drive has transitioned to the long term data retention state 850. When the solid state drive is powered up and receives a command, the solid state drive determines, at 851, whether it is being instructed to exit from the long term data retention state and transition back to the normal operating state. If the solid state drive is not being instructed to exit from the long term data retention state and transition back to the normal operating state it determines, at 860, whether the command is a read command or other non-write command. If the command is a write command, the solid state drive returns, at 864, an error indicating that the command is an illegal operation that is not allowed.

If the command is a read command, the solid state drive selects, at 861, a threshold voltage to be used to read raw (encoded) data from the flash memory. The selecting of the threshold voltage may include performing a plurality of trial reads, from the flash memory, at different respective threshold voltages (e.g., sweeping the threshold voltage over a range of voltages), to obtain a corresponding set of raw data words, and performing a hard-decision decoding attempt with each of the raw data words or performing a soft-decision decoding attempt with a set of raw data words. If none of the decoding attempts is successful, the solid state drive may return an error message. If only one of the decoding attempts is successful, the solid state drive may select, for use in subsequent read operations, the threshold voltage (Vt_min) that resulted in the successful decoding attempt. If several of the decoding attempts are successful, the solid state drive may select, for use in subsequent read operations, the threshold voltage (Vt_min) that resulted in the lowest error rate from among the error rates produced by the successful decoding attempts. The solid state drive then reads raw data corresponding to the read command, decodes it at the second (LTDR) code rate, and returns the decoded data to the host.

In another embodiment, the solid state drive may instead perform adaptive multiple reads with soft decision decoding attempts, as disclosed in the '962 Application, i.e., performing additional reads at additional threshold voltage values, until a decoding attempt succeeds.

If at 851 the solid state drive determines that it is being instructed to exit from the long term data retention state and transition back to the normal operating state, then it selects, at 852, a threshold voltage (Vt_min), e.g., using the same method as that used at 862, and, at 853, sets the threshold voltage to be used for subsequent reads to Vt_min. it then, at 854, sets the code rate to a higher code rate than the second (LTDR) code rate (e.g., to the code rate $CR_{new}$) and begins, at 855, (i) performing normal operations, accepting commands and performing garbage collection as needed (using the reserved free pool 751), while concurrently (ii) re-storing the data using the third code rate, i.e., reading the data from flash memory, decoding it at the second code rate, encoding it at the third code rate (to form "third encoded data"), and storing the third encoded data in the flash memory. Once the re-storing is complete, the solid state drive returns, at 856, to normal operations. $CR_{new}$ can be expressed as $(U(GB)+S(GB))/(((C(GiB)-Y(GiB))*1.0737/CR_{def})*(1-OP))$, where OP is an over-provisioning fraction selectable by the host or solid state drive.

As used herein, a "flash memory" is any quantity of flash memory. The flash memory may be in the form of one or more flash memory dies or one or more flash memory packages, each flash memory package containing one or more flash memory dies. As such, a plurality of flash memories may together form a flash memory, and a flash memory may include a plurality of flash memories.

The controller, the ECC engine, and other circuits described herein, or circuits for performing any of the functions described herein, may be implemented in one or more processing circuits. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

As used herein, "a portion of" something means all, or less than all, of the thing. As such, for example "a portion the first encoded data" means all or less than all of the first encoded data. As used herein, the word "or" is inclusive, so that, for example, "A or B" means any one of (i) A, (ii) B, and (iii) A and B. It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used"

may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for improving the data retention characteristics of a storage system using flash memory have been specifically described and illustrated herein, many modifications and variations will be apparent to those skilled in the art. Accordingly, it is to be understood that a system and method for improving the data retention characteristics of a storage system using flash memory constructed according to principles of this disclosure may be embodied other than as specifically described herein. The invention is also defined in the following claims, and equivalents thereof.

What is claimed is:

1. A method, comprising:
    transitioning a flash memory to a data retention state by re-storing first encoded data, the first encoded data being initially stored in the flash memory at a first code rate, the re-storing comprising:
    determining a second code rate based on a total data volume and a total available capacity, the second code rate being lower than the first code rate;
    reading the first encoded data from the flash memory;
    decoding the first encoded data at the first code rate to obtain first decoded data;
    encoding the first decoded data at the second code rate to form second encoded data; and
    storing the second encoded data in the flash memory.

2. The method of claim 1, wherein the re-storing further comprises, after reading a portion of the first encoded data from a first physical block of the flash memory, erasing the first physical block.

3. The method of claim 2, further comprising erasing a second physical block after erasing the first physical block, the amount of valid data on the first physical block before the erasing of the first physical block being less than the amount of valid data on the second physical block before the erasing of the second physical block.

4. The method of claim 2, wherein the re-storing further comprises reading all valid data from the first physical block before erasing the first physical block.

5. The method of claim 1, wherein the determining of the second code rate comprises selecting a code rate greater than a first ratio, the first ratio being the ratio of:
    the total data volume and
    the total available capacity.

6. The method of claim 5, wherein:
    the total data volume is a sum of a total user data volume and a total system data volume;
    the total available capacity is a difference between a total capacity and a reserve capacity; and
    the selecting of a code rate greater than a first ratio comprises selecting from among a set of available code rates the smallest code rate greater than the first ratio.

7. The method of claim 1, further comprising, in response to a request from a host:
    reading, while in the data retention state, a portion of the second encoded data,
    decoding the portion of the second encoded data to obtain decoded data, and
    sending the decoded data to the host.

8. The method of claim 7, further comprising, before the reading of the portion of the second encoded data:
    performing a plurality of trial reads at different respective threshold voltages from the flash memory, to obtain a corresponding set of raw data words;
    performing, with the raw data words, one or more successful decoding attempts and zero or more unsuccessful decoding attempts, to obtain an error rate for each successful coding attempt; and
    selecting a threshold voltage for use during the reading of the portion of the second encoded data.

9. The method of claim 8, wherein:
    the performing of the one or more successful decoding attempts comprises performing a plurality of successful decoding attempts; and
    the selecting of the threshold voltage for use during the reading of the portion of the second encoded data comprises selecting a threshold voltage used during a successful decoding attempt, of the plurality of successful decoding attempts, having a minimum error rate.

10. The method of claim 9, wherein the reading of the portion of the second encoded data comprises:
    performing a first read operation on a first plurality of flash memory cells, at a first reference voltage, to form a first raw data word;
    executing a first error correction code decoding attempt with the first raw data word;
    when the first error correction code decoding attempt succeeds:
        outputting a decoded data word generated by the first error correction code decoding attempt; and
    when the first error correction code decoding attempt does not succeed:
        performing a second read operation on the first plurality of flash memory cells, at a second reference voltage, to form a second raw data word; and
        executing a second error correction code decoding attempt with the first raw data word and the second raw data word.

11. The method of claim 1, further comprising transitioning from the data retention state to a normal operating state, the transitioning comprising:
    reading the second encoded data from the flash memory;
    decoding the second encoded data to obtain second decoded data;

encoding the second decoded data at a third code rate, greater than the second code rate, to obtain third encoded data; and storing the third encoded data in the flash memory.

12. The method of claim 11, further comprising, before the reading of the second encoded data:

performing a plurality of trial reads at different respective threshold voltages from the flash memory, to obtain a corresponding set of raw data words;

performing, with the raw data words, one or more successful decoding attempts and zero or more unsuccessful decoding attempts, to obtain an error rate for each successful coding attempt; and selecting a threshold voltage for use during the reading of the second encoded data.

13. The method of claim 12, wherein:

the performing of the one or more successful decoding attempts comprises performing a plurality of successful decoding attempts; and the selecting of the threshold voltage for use during the reading of the second encoded data comprises selecting a threshold voltage used during a successful decoding attempt, of the plurality of successful decoding attempts, having a minimum error rate.

14. A solid state drive, comprising:

a flash memory; and a processing circuit, the processing circuit being configured to transition the flash memory to a data retention state by re-storing first encoded data, the first encoded data being initially stored in the flash memory at a first code rate, the re-storing comprising:

determining a second code rate based on a total data volume and a total available capacity, the second code rate being lower than the first code rate;

reading the first encoded data from the flash memory;

decoding the first encoded data at the first code rate to obtain first decoded data;

encoding the first decoded data at the second code rate to form second encoded data; and storing the second encoded data in the flash memory.

15. The solid state drive of claim 14, further comprising an error correcting code engine, the error correcting code engine being capable of:

encoding data at the first code rate;
encoding data at the second code rate;
decoding data at the first code rate; and
decoding data at the second code rate.

16. The solid state drive of claim 14, wherein the processing circuit is configured, in response to a request from a host, to:

read, while in the data retention state, a portion of the second encoded data, decode the portion of the second encoded data to obtain decoded data, and send the decoded data to the host.

17. The solid state drive of claim 16, wherein the processing circuit is further configured, before the reading of the portion of the second encoded data, to:

perform a plurality of trial reads at different respective threshold voltages from the flash memory, to obtain a corresponding set of raw data words;

perform, with the raw data words, one or more successful decoding attempts and zero or more unsuccessful decoding attempts, to obtain an error rate for each successful coding attempt; and select a threshold voltage for use during the reading of the portion of the second encoded data.

18. The solid state drive of claim 17, wherein:

the performing of the one or more successful decoding attempts comprises performing a plurality of successful decoding attempts; and the selecting of the threshold voltage for use during the reading of the portion of the second encoded data comprises selecting a threshold voltage used during a successful decoding attempt, of the plurality of successful decoding attempts, having a minimum error rate.

19. The solid state drive of claim 14, wherein the processing circuit is further configured to transition from the long term data retention state to a normal operating state, the transitioning comprising:

reading the second encoded data from the flash memory;
decoding the second encoded data to obtain second decoded data;

encoding the second decoded data at a third code rate, greater than the second code rate, to obtain third encoded data; and storing the third encoded data in the flash memory.

* * * * *

UNITED STATES PATENT AND TRADEMARK OFFICE
CERTIFICATE OF CORRECTION

PATENT NO. : 10,795,765 B2  
APPLICATION NO. : 16/592727  
DATED : October 6, 2020  
INVENTOR(S) : Guangming Lu Page 1 of 1

It is certified that error appears in the above-identified patent and that said Letters Patent is hereby corrected as shown below:

In the Claims

In Column 14, Line 38, Claim 19 before "data" delete "long term"

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*